United States Patent
Kim

(10) Patent No.: US 10,483,474 B2
(45) Date of Patent: Nov. 19, 2019

(54) ORGANIC LIGHT-EMITTING DEVICE WITH ELECTRON BLOCKING LAYER AND TRAPPING LAYER AND ORGANIC LIGHT-EMITTING DISPLAY USING THE SAME

(71) Applicant: LG Display Co., Ltd., Seoul (KR)

(72) Inventor: Bo-Seong Kim, Yongin-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/661,233

(22) Filed: Jul. 27, 2017

(65) Prior Publication Data

US 2018/0033990 A1    Feb. 1, 2018

(30) Foreign Application Priority Data

Jul. 29, 2016    (KR) .................. 10-2016-0097549

(51) Int. Cl.
*H01L 51/50*    (2006.01)
*H01L 27/32*    (2006.01)
*H01L 51/00*    (2006.01)

(52) U.S. Cl.
CPC .......... *H01L 51/5004* (2013.01); *H01L 51/50* (2013.01); *H01L 51/5056* (2013.01);
(Continued)

(58) Field of Classification Search
CPC ............. H01L 51/5004; H01L 51/5056; H01L 51/5096; H01L 51/50
See application file for complete search history.

(56) References Cited

U.S. PATENT DOCUMENTS

2007/0085115 A1*   4/2007   Chen ................ H01L 21/28282
                                                                257/291
2007/0141395 A1*   6/2007   Chun .................. H01L 51/0051
                                                                428/690
(Continued)

FOREIGN PATENT DOCUMENTS

CN    102214794 A    10/2011
CN    105304825 A     2/2016
(Continued)

OTHER PUBLICATIONS

Extended European Search Report dated Nov. 20, 2017, issued in corresponding European Application No. 17182739.7.
(Continued)

*Primary Examiner* — Allen L Parker
*Assistant Examiner* — Gustavo G Ramallo
(74) *Attorney, Agent, or Firm* — Morgan, Lewis & Bockius LLP

(57) ABSTRACT

An organic light-emitting device includes: an anode, a hole transport layer over the anode, an electron blocking layer over the hole transport layer, an organic emitting layer contacting the electron blocking layer, an electron transport layer contacting the organic emitting layer, a cathode over the electron transport layer, and a trapping layer between the hole transport layer and the electron blocking layer, wherein a LUMO energy level of the trapping layer: differs from a HOMO energy level of the electron blocking layer within a range of 1 eV, or is equal to the HOMO energy level of the electron blocking layer.

12 Claims, 8 Drawing Sheets

(52) U.S. Cl.
CPC ...... *H01L 51/5096* (2013.01); *H01L 27/3244* (2013.01); *H01L 51/0072* (2013.01); *H01L 2251/552* (2013.01)

(56) References Cited

U.S. PATENT DOCUMENTS

| | | | |
|---|---|---|---|
| 2007/0141396 A1 | 6/2007 | Chun et al. | |
| 2008/0315753 A1 | 12/2008 | Liao et al. | |
| 2011/0240967 A1 | 10/2011 | Lee et al. | |
| 2012/0267618 A1 | 10/2012 | Monkman et al. | |
| 2013/0264551 A1* | 10/2013 | Pieh | H01L 51/5056 257/40 |
| 2014/0183475 A1* | 7/2014 | Song | H01L 51/5044 257/40 |
| 2015/0280162 A1* | 10/2015 | Yoon | B82Y 10/00 257/40 |
| 2015/0311463 A1 | 10/2015 | Park et al. | |
| 2016/0028022 A1 | 1/2016 | Seo et al. | |

FOREIGN PATENT DOCUMENTS

| | | |
|---|---|---|
| JP | H04-220995 A | 8/1992 |
| JP | H04-0220995 A | 8/1992 |
| JP | H10-88120 A | 4/1998 |
| JP | H10-188120 A | 4/1998 |
| JP | 2011-216861 A1 | 10/2011 |
| WO | 2008/156554 A1 | 12/2008 |
| WO | 2011/042443 A1 | 2/2011 |

OTHER PUBLICATIONS

Chinese Office Action dated Oct. 31, 2018, issued in counterpart Chinese Application No. 201710629577.2.
Kyoung Soo Yook et al., "Efficient hole injection by doping of hexaazatriphenylene hexacarbonitrile in hole transport layer," Thin Solid Films, vol. 517, No. 21, May 14, 2009, pp. 6109-6111.
Taiwanese Office Action dated Jun. 22, 2018, issued in counterpart Taiwanese Application No. 10720562020.
Japanese Office Action dated Aug. 7, 2018, issued in counterpart Japanese Application No. 2017-145396.
European Search Report dated Aug. 24, 2018, issue in counterpart European Application No. 17 182 739.7.
Japanese Office Action dated May 7, 2019, issued in counterpart Japanese Application No. 2017-145396.

* cited by examiner

ORGANIC LIGHT-EMITTING DEVICE WITH ELECTRON BLOCKING LAYER AND TRAPPING LAYER AND ORGANIC LIGHT-EMITTING DISPLAY USING THE SAME

CROSS-REFERENCE TO RELATED APPLICATION(S)

This application claims the priority of Korean Application No. 10-2016-0097549, filed on Jul. 29, 2016, the entirety of which is hereby incorporated by reference.

BACKGROUND

1. Technical Field

The present disclosure relates to an organic light-emitting device, and more particularly, to an organic light-emitting device that provides increased lifespan and decreased driving voltage, and an organic-light-emitting display using the same.

2. Discussion of the Related Art

In the information age, the field of displays visually expressing signals related to electrical information has rapidly developed. To satisfy such a trend, various flat display devices having excellent performance, such as thinness, light weight, and low power consumption, have been researched as a substitute for a conventional cathode ray tube (CRT) display device. Examples of flat display devices include liquid crystal displays (LCDs), plasma display panels (PDPs), field emission displays (FEDs), organic light-emitting diode (OLED) displays, etc. The OLED display requires no separate light source, and has been considered to be competitive in achieving compactness and good color reproduction.

The organic light-emitting display includes a plurality of sub-pixels, and each sub-pixel includes an organic light-emitting device. An OLED includes an anode, a cathode, and a plurality of organic layers between the anode and the cathode. The organic light-emitting device emits light when a current is applied between the anode and the cathode.

At least one layer of the organic layers between the anode and the cathode is an organic light-emitting layer. Holes and electrons from the anode and cathode are injected into the organic light-emitting layer and are combined with each other in the organic light-emitting layer, thus generating excitons. When the generated excitons are changed from an excited state to a ground state, the organic light-emitting diode emits light. For example, a basic structure of the organic light-emitting diode includes an anode and a cathode, and a hole injection layer, a hole transport layer, an organic light-emitting layer, an electron transport layer and electron injection layer sequentially stacked from the anode, between the anode and the cathode.

Meanwhile, it is preferable that the electrons and the holes are contained in the organic light-emitting layer for high emission efficiency. For this, it has been suggested to provide an electron blocking layer (EBL) between the hole transport layer and the organic light-emitting layer, such that the electron blocking layer prevents the electrons from leaking in the organic light-emitting layer when the current is applied between the anode and the cathode.

However, some electrons from the organic light-emitting layer may escape to the hole transport layer, even though the electron blocking layer is provided. Thus, the moved electrons remain in the hole transport layer, and cause deterioration of the hole transport layer and higher driving voltage.

Accordingly, there is a difficulty to realize a particular extended lifetime for the device.

Also, the electron blocking layer requires a broad bandgap for smoothly transporting holes and blocking electrons, but known materials used for the electron blocking layer have high LUMO (Lowest Unoccupied Molecular Orbital) and high HOMO (Highest Occupied Molecular Orbital), and thus have a narrow bandgap. Therefore, the organic light-emitting device having the electron blocking layer of known material has problems, such as insufficient hole injection/transportation into the light-emitting layer and high driving voltage.

SUMMARY

Accordingly, the present disclosure is directed to an organic light-emitting device and an organic light-emitting display using the same that substantially obviate one or more of the issues due to limitations and disadvantages of the related art.

An aspect of the present disclosure is to provide an organic light-emitting device that provides increased lifespan and decreased driving voltage, and an organic light-emitting display using the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided an organic light-emitting device, including: an anode, a hole transport layer over the anode, an electron blocking layer over the hole transport layer, an organic emitting layer contacting the electron blocking layer, an electron transport layer contacting the organic emitting layer, a cathode over the electron transport layer, and a trapping layer between the hole transport layer and the electron blocking layer, wherein a LUMO energy level of the trapping layer: differs from a HOMO energy level of the electron blocking layer within a range of 1 eV, or is equal to the HOMO energy level of the electron blocking layer.

In another aspect, there is provided an organic light-emitting device, including: a substrate including a plurality of subpixels, a thin-film transistor in each subpixel over the substrate, and an organic light-emitting element at each sub-pixel, the organic light-emitting element including: an anode, a hole transport layer over the anode, an electron blocking layer over the hole transport layer, an organic emitting layer contacting the electron blocking layer, an electron transport layer contacting the organic emitting layer, a cathode over the electron transport layer, and a trapping layer between the hole transport layer and the electron blocking layer, wherein each thin-film transistor is connected to one of: the anode and the cathode, and wherein a LUMO energy level of the trapping layer: differs from a HOMO energy level of the electron blocking layer within a range of 1 eV, or is equal to the HOMO energy level of the electron blocking layer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain various principles of the disclosure.

Figure 1:
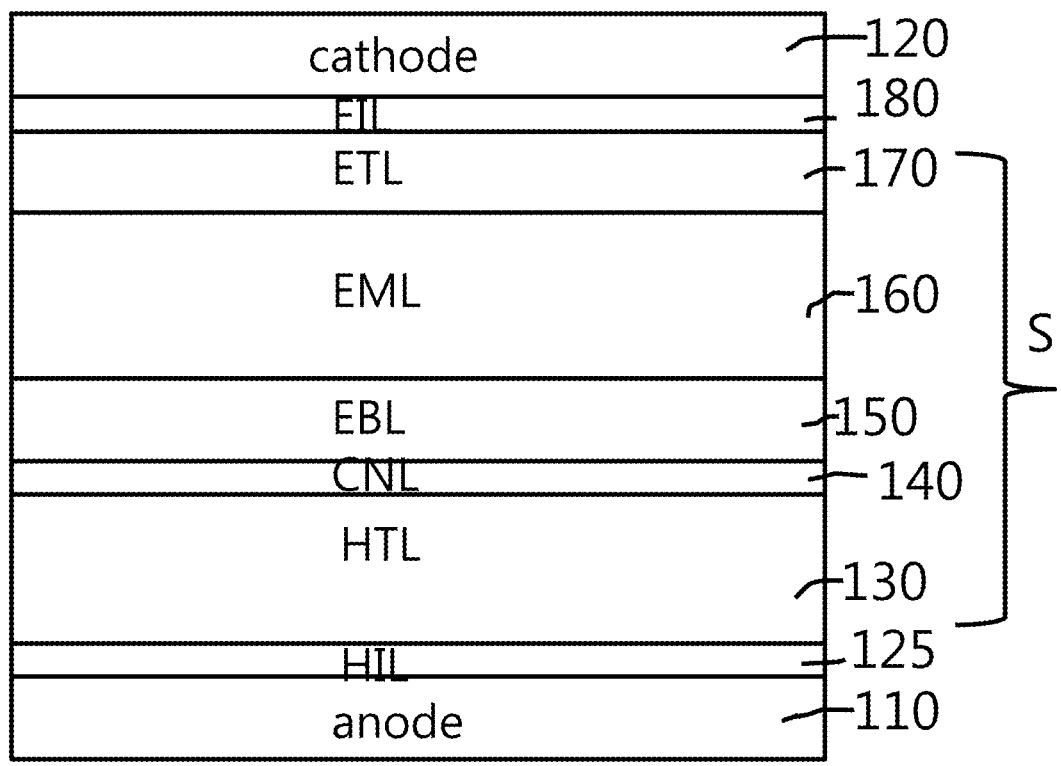
FIG. 1 is a cross-sectional view illustrating an organic light-emitting device in accordance with a first embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to some embodiments of the present disclosure, examples of which are illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

FIG. 1 is a cross-sectional view illustrating an organic light-emitting device in accordance with a first embodiment of the present disclosure.

As shown in the FIG. 1 example, an organic light-emitting device in accordance with a first embodiment of the present disclosure may include an anode 110, a hole transport layer (HTL) 130 on the anode 110, an electron blocking layer (EBL) 150 on the hole transport layer 130, an organic emitting layer (EML) 160 contacting the electron blocking layer 150, and an electron transport layer (ETL) 170 contacting the organic emitting layer 160, a cathode 120 on the electron transport layer 170, and a trapping layer (CNL) 140 between the hole transport layer 130 and the electron transport layer 150. A LUMO energy level of the trapping layer 140 may differ from a HOMO energy level of the electron blocking layer within a range of 1 eV, or may be equal to the HOMO energy level of the electron blocking layer.

In addition, a hole injection layer (HIL) 125 may be further provided between the anode 110 and the hole transport layer 130, e.g., to increase efficiency of hole injection. Moreover, an electron injection layer (EIL) 180 may be further provided between the electron transport layer 170 and the cathode 120, e.g., to increase efficiency of electron injection. The hole injection layer 125 and the electron injection layer 180 may be selectively provided, or the same function may be achieved by mixing hole injection material into the hole transport layer and electron injection material into the electron transport layer, respectively.

The trapping layer 140 between the hole transport layer 130 and the electron blocking layer 150 can trap escaped electrons from the electron blocking layer 150, and may help block the electrons from the organic emitting layer 160 with the electron blocking layer 150. Even though the electron blocking layer 150 may block the electrons from the organic emitting layer 160, the electron blocking layer 150 cannot block total escape of electrons by itself. The trapping layer 140 according to an embodiment of the present disclosure has a lower LUMO (Lowest Unoccupied Molecular Orbital), and is provided between the hole transport layer 130 and the electron blocking layer 150. Therefore, escaped electrons from the electron blocking layer 150 may be captured as a lower energy level in the trapping layer 140. That is, electrons that have escaped from the electron blocking layer 150 toward the hole transport layer 130 may be captured into the trapping layer when voltages are applied to the anode 110 and the cathode 120.

The stack "S" in the FIG. 1 example is a basic organic stack between the anode 110 and cathode 120. The layers in the organic stack S are organic layers. An energy band of embodiments of the present disclosure is explained in the following description.

Figure 2:
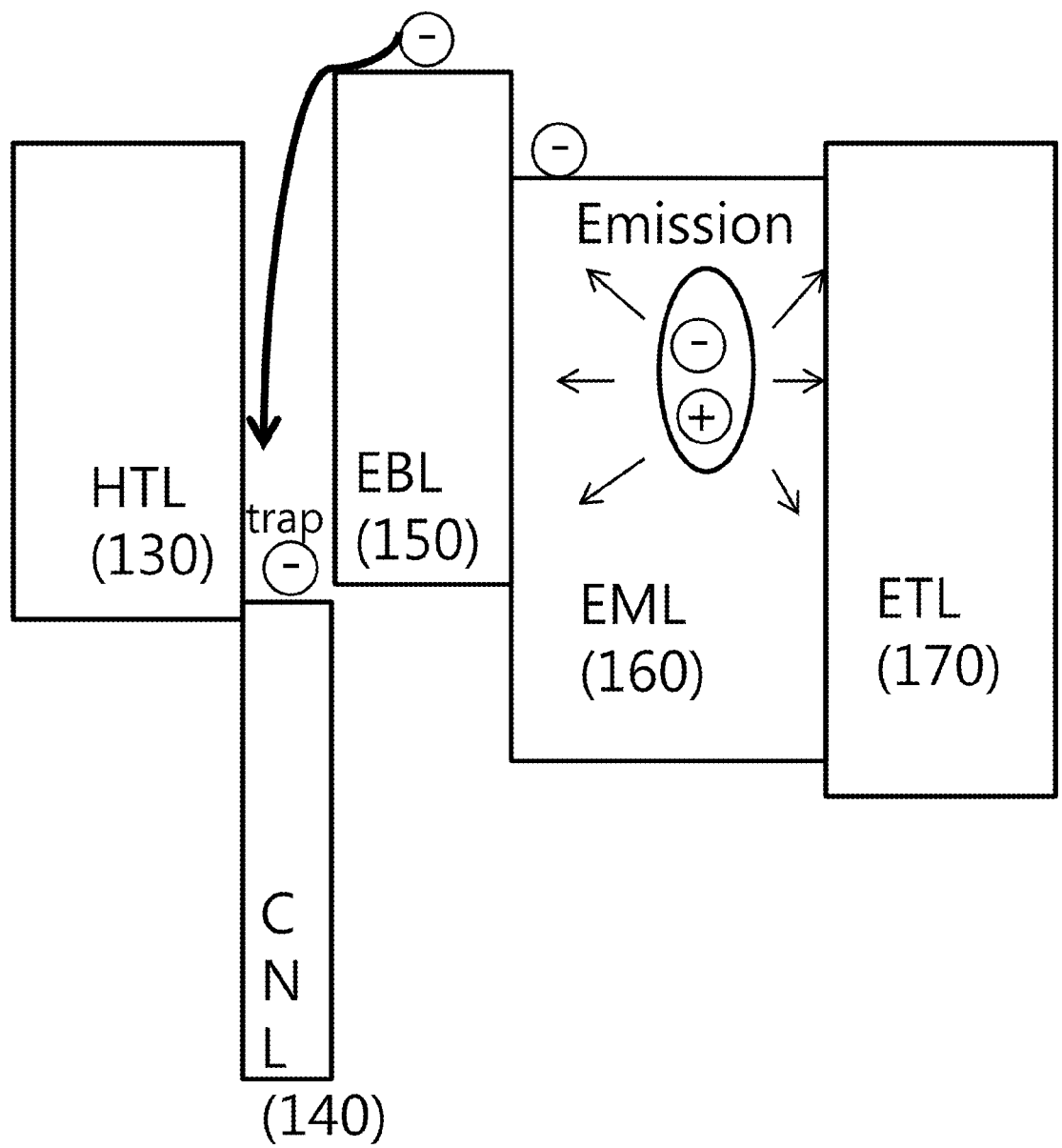
FIG. 2 is a band diagram of an organic light-emitting device in accordance with an embodiment of the present disclosure.
Figure 3:
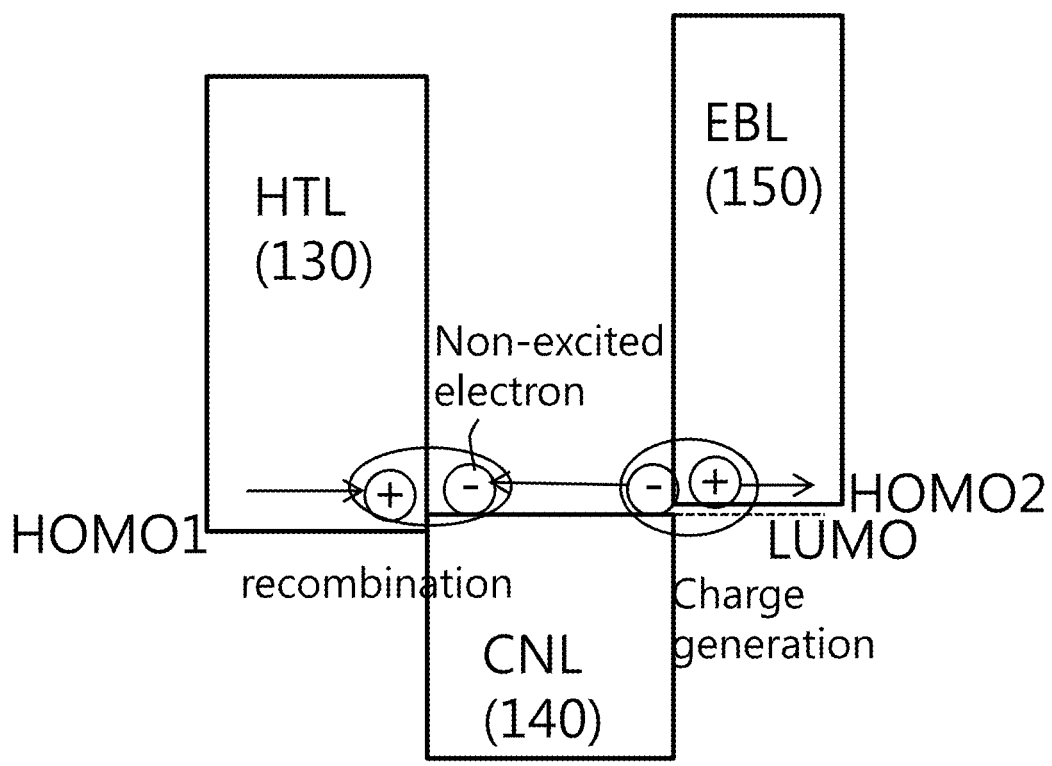
FIG. 3 is a diagram to show functionality between the hole transport layer and the electron blocking layer.

FIG. 2 is a band diagram of an organic light-emitting device in accordance with an embodiment of the present disclosure. FIG. 3 is a diagram to show a functionality between the hole transport layer and the electron blocking layer.

As shown in the FIG. 2 example, firstly, if a LUMO energy level of the electron blocking layer 150 is higher than a LUMO energy level of the organic emitting layer 160, it is difficult for the electrons in the organic emitting layer 160 to escape toward the hole transport layer 130. However, if a current is applied between the anode 110 and the cathode 120, and a difference of LUMOs between the electron blocking layer 150 and the organic light-emitting layer 160 is within a range of 1 eV, the electrons can escape through the electron blocking layer 150. For example, the amount or number of escaped electrons from the electron blocking layer 150 may increase when the current between the anode 110 and the cathode 120 becomes higher.

Also, the escaped electrons from the organic emitting layer that are not contained in the electron blocking layer can move toward an adjacent layer. In an embodiment of the present disclosure, the trapping layer 140 contacts the electron transport layer 150 so that the escaped electrons are captured in the trapping layer 140. Thus, the trapping layer 140 can block the electrons from moving into the hole transport layer 130.

The LUMO energy level of the trapping layer 140 is equal to or similar to the HOMO energy level HOMO2 of the electron blocking layer 150, as shown in the FIG. 3 example. Even though there are escaped electrons from the electron blocking layer 150, the energy level of the escaped electrons is lowered to a low energy level, and the escaped electrons are captured into the trapping layer 140. Thus, an energy level of the electrons captured in the trapping layer 140 is a non-exited state. Therefore, although holes from the hole transport layer 130 and escaped electrons may be partially combined in the trapping layer 140, a non-emission state is maintained in the trapping layer 140. Although electrons of a low energy level may be partially moved into the hole transport layer 130, the holes cannot cause deterioration of the hole transport layer and increase of a driving voltage, and hole transporting efficiency is highly maintained because holes occupy the depleted state of electrons in the organic emitting layer 160.

FIG. 3 shows that the LUMO energy level LUMO of the trapping layer 140 is similar to the HOMO energy level HOMO1 of the hole transport layer 130. The LUMO energy level LUMO of the trapping layer 140 is not limited to such. For example, the LUMO energy level LUMO of the trapping layer 140 may differ from the HOMO energy level HOMO1 of the hole transport layer 130 within a range of, e.g., 1 eV, and the LUMO energy level LUMO of the trapping layer 140 may differ from the HOMO energy level HOMO2 of the electron blocking layer 150 within a range of, e.g., 1 eV, or may be same to the HOMO energy level HOMO2 of the electron blocking layer 150. That is, the LUMO energy level LUMO of the trapping layer 140 may be lower than the HOMO energy level HOMO2 of the electron blocking layer 150 within 1 eV, or may be higher than the HOMO energy level HOMO2 of the electron blocking layer 150 within 1 eV. That is, a range of the LUMO energy level LUMO of the trapping layer 140 is "the HOMO energy level HOMO2 of the electron blocking layer 150 minus (−) 1 eV" to "the HOMO energy level HOMO2 of the electron blocking layer 150 plus (+) 1 eV." In one example, the LUMO energy level LUMO of the trapping layer 140 is lower than the HOMO energy level HOMO2 of the electron blocking layer 150, such that the energy level of the escaped electrons is lowered.

As used herein, the LUMO energy levels and HOMO energy levels are all negative values, and a LUMO energy level or a HOMO energy level located higher in the band diagram has a lower absolute value. In the description, each value of the LUMO energy levels and HOMO energy levels is compared to each substantial negative value shown in the band diagram.

Meanwhile, each energy bandgap of the hole transport layer 130, the trapping layer 140, and the electron blocking layer 150 is 2 eV or more. Thus, the HOMO energy level of trapping layer 140 is lower than the HOMO energy level HOMO2 of the electron blocking layer 150.

The LUMO energy level LUMO of the trapping layer 140 may be similar to the HOMO energy level HOMO1 of the hole transport layer 130 and the HOMO energy level HOMO2 of the electron blocking layer 150 to lower the energy level of the escaped electrons as a non-excited state and to move the electrons into the trapping layer 140 and block transporting electrons into the hole transport layer 130, even though there are partially-escaped electrons from the electron blocking layer 150 into the hole transport layer 130.

Meanwhile, when a current is applied between an anode 110 and a cathode 120, some electrons may be combined with the holes at an interface between the trapping layer 140 and the hole transport layer 130. However, the electrons from and in the trapping layer 140 have a low energy level, and a combined hole and electron at the interface between the trapping layer 140 and the hole transport layer 130 has no excited level. Thus, a combined hole and electron at the interface between the trapping layer 140 and the hole transport layer 130 cannot emit light. Further, although non-combined electrons may be partially moved to the hole transport layer 130, electrons of the low energy level do not deteriorate the hole transport layer 130 and do not increase the driving voltage. In addition, if electrons that escape from in the organic emitting layer 160 can be occupied with holes, and holes through the hole transport layer 130, trapping layer 140, and the electron blocking layer 150 are smoothly provided into the organic emitting layer 160. Thus, recombination of holes and electrons in the organic emitting layer 160 is increased, which may increase emission efficiency. In this case, the trapping layer 140 may also provide charge generation.

As shown in the example of FIG. 3, the LUMO energy level LUMO of the trapping layer 140 may be lower than the HOMO energy level HOMO2 of the electron blocking layer 150, such that the energy level of the escaped electrons from the electron blocking layer 150 near to the HOMO energy level HOMO2 of the electron blocking layer 150 may be lowered below the LUMO energy level LUMO of the trapping layer 140. In this case, the HOMO energy level HOMO1 of the hole transport layer 130 can be slightly lower than the HOMO energy level HOMO2 of the electron blocking layer 150, and also, the HOMO energy level HOMO1 may be lower than the LUMO energy level LUMO of the trapping layer 140, as shown in FIG. 3.

For example, the LUMO energy level LUMO of the trapping layer 140 may be between the HOMO energy level HOMO1 of the hole transport layer 130 and the HOMO energy level HOMO2 of the electron blocking layer 150, or may be the same as the HOMO energy level HOMO1 of the hole transport layer 130 or the HOMO energy level HOMO2 of the electron blocking layer 150 for effectively trapping the escaped electrons and trapping holes.

For example, the HOMO energy level HOMO1 of the hole transport layer 130 may be −5.6 eV to −5.4 eV, and the HOMO energy level HOMO2 of the electron blocking layer 150 may be −5.3 eV to −5.0 eV. In this case, the LUMO energy level LUMO of the trapping layer 140 may be −5.6 eV to −5.0 eV.

In an organic light-emitting device according to an embodiment, it may be effective that the HOMO energy level HOMO2 of the electron blocking layer 150 is higher than the HOMO energy level of the organic emitting layer 160 by, e.g., 0.4 eV or more. This may compensate for a material limit of the electron blocking layer 150 having a narrow bandgap by providing the trapping layer 140. If the electron blocking layer is in contact with the hole transport layer without a trapping layer, and some electrons escape from the electron blocking layer, the escaped electrons may be easily moved into the hole transport layer. Thus, the escaped electrons having a high energy level may cause deterioration of the hole transport layer. On the contrary, the organic light-emitting device according to an embodiment has the trapping layer 140 having a low LUMO energy level LUMO similar to or the same as the HOMO energy level HOMO2 of the electron blocking layer 150. Thus, the escaped electrons can be captured in the trapping layer 140, and few or no escaped electrons may move into the hole transport layer 130. Accordingly, embodiments reduce or prevent deterioration of the hole transport layer 130 caused by the accumulation of electrons at the interface of the hole transport layer 130, which may increase the lifespan of the device.

For example, material for the trapping layer 140 may be any one of HATCN, F4TCNQ, and MoO3 to meet the above LUMO energy level LUMO, and material for the hole transport layer 130 may be any one of N,N'-bis-(1-naphthalenyl)-N,N'-bis-phenyl-(1,1'biphenyl)-4,4'-diamine (NPB, also referred to as N,N'-bis(naphthalene-1-yl)-N,N'-bis(phenyl)benzidine (NPD)), α-NPD, BBTC, NPhen, or a derivative thereof to meet the above HOMO energy level HOMO1. Further, material for the electron blocking layer 150 may be any one of TAPC, TCTA, or a derivative thereof to meet the above HOMO energy level HOMO2. The materials for the trapping layer 140, the hole transport layer 130, and the electron blocking layer 150 are not limited to the above-mentioned examples, and may be replaced with another material that can meet the energy band diagram of FIGS. 2 and 3.

Meanwhile, in one example, a thickness of the trapping layer 140 may be, e.g., less than or equal to ⅕ times of a thickness of hole transport layer 130, or a thickness of the trapping layer 140 may be, e.g., less than ⅒ times of a thickness of hole transport layer 130. Because the thickness of the trapping layer 140 may be too thin to selectively function for trapping the escaped electrons, transportability of hole may be maintained from the hole transport layer 130 to the organic emitting layer 160. For example, the thickness of the hole transport layer 130 may be, e.g., 100 Å to 2000 Å, and the thickness of the electron blocking layer 150 may be, e.g., 30 Å to 300 Å. That is, the hole transport layer 130 and the electron blocking layer 150 may be thicker than the thickness of the trapping layer 140 less than, e.g., 10 Å. Thus, a velocity of hole transporting may be maintained to ignore the trapping layer 140 between the hole transport layer 130 to the organic emitting layer 160.

In one example, the thickness of the trapping layer 140 may be, e.g., about 5 Å to 10 Å. If the thickness of the trapping layer 140 is smaller than 5 Å, the trapping layer 140 may not properly trap the escaped electrons. If the thickness of the trapping layer 140 is larger than, e.g., 10 Å, the driving voltage may be increased. This explained in further detail by experimental examples below.

Figure 4:
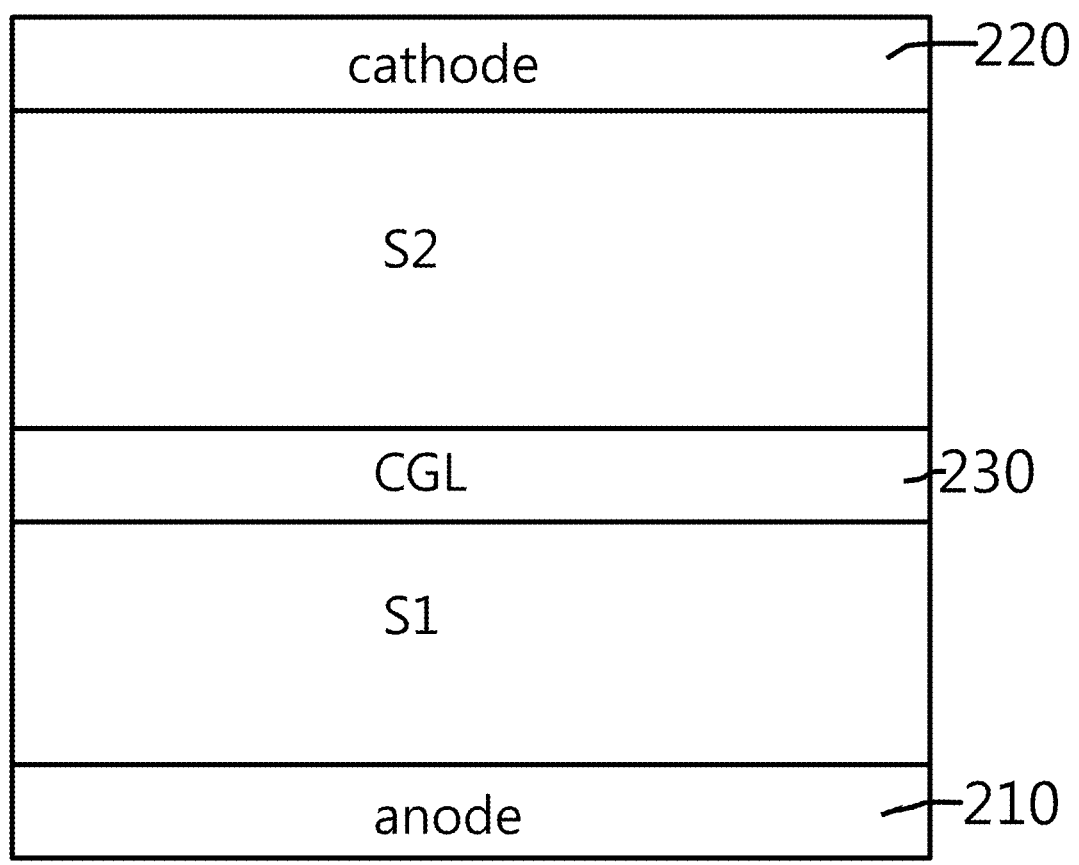
FIG. 4 is a cross-sectional view illustrating an organic light-emitting device in accordance with a second embodiment of the present disclosure.

FIG. 4 is a cross-sectional view illustrating an organic light-emitting device in accordance with a second embodiment of the present disclosure.

As shown in the FIG. 4 example, an organic light-emitting device in accordance with the second embodiment of the present disclosure may include a plurality of stacks S1, S2, ... between an anode 210 and a cathode 220. Each stack may include the hole transport layer 130, the trapping layer 140, the electron blocking layer 150, the organic emitting layer 160, and the electron transport layer 170 of the FIG. 1 example. A charge generation layer 230 may be provided between stacks S1 and S2. Differently from the example of FIG. 4, the organic light-emitting device in accordance with the second embodiment of the present disclosure may have three or more stacks, and each charge generation layer (CGL) 230 may be positioned between two stacks S1, S2, ...

The organic light-emitting device in accordance with the second embodiment of the present disclosure has similar advantages to have the trapping layer 140 between the hole transport layer 130 and the electron blocking layer 150 in the stack S1, S2 ..., such as the organic light-emitting device in accordance with the first embodiment of the present disclosure.

Hereinafter, a comparative example and experimental examples are compared. The comparative example corresponds to the structure of the FIG. 1 example, except without the trapping layer 140. The comparative example may be applied to the stacks of FIG. 5.

Figure 5:
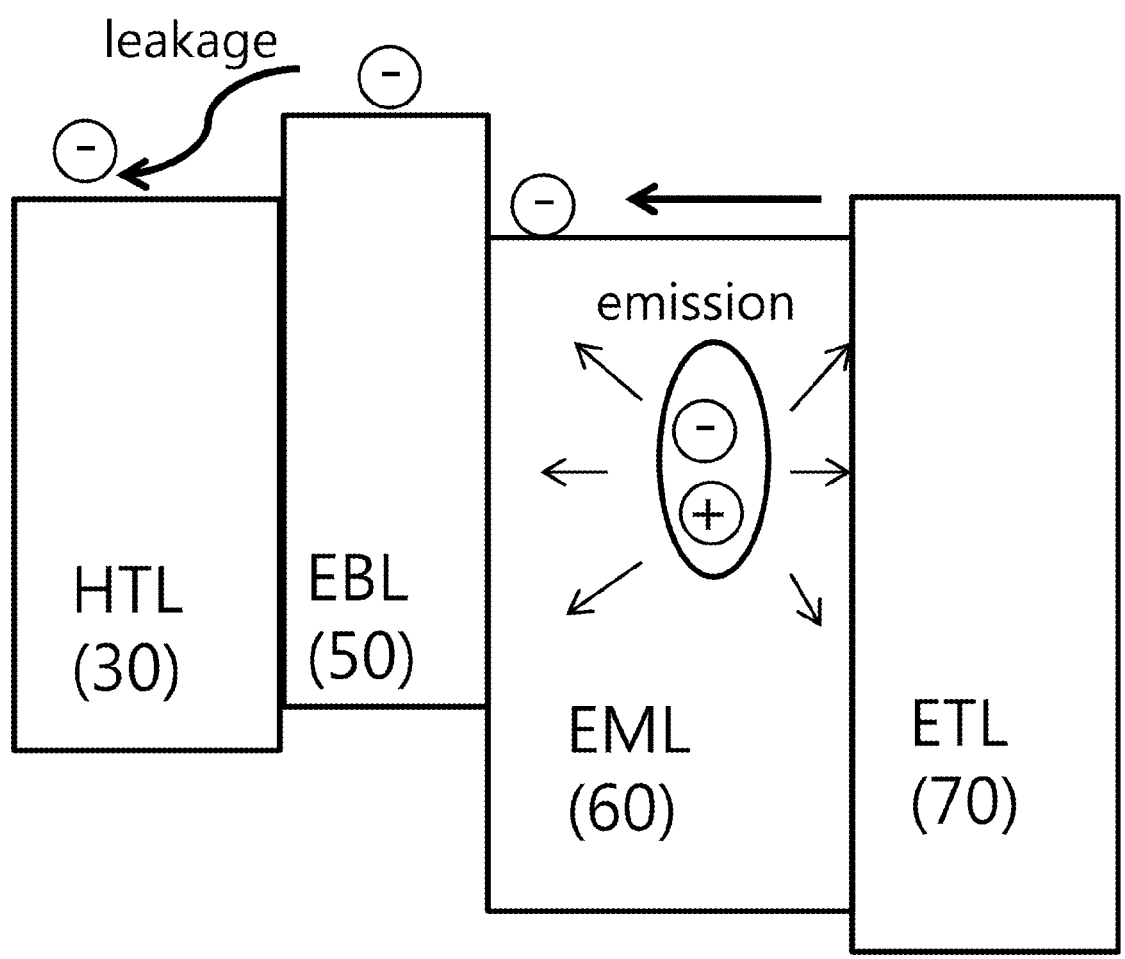
FIG. 5 is a band diagram of an organic light-emitting device in accordance with a comparative example.

FIG. 5 is a band diagram of an organic light-emitting device in accordance with the comparative example.

As shown in FIG. 5, the organic light-emitting device in accordance with the comparative example includes a hole transport layer 30, an electron blocking layer 50, an organic emitting layer 60, and an electron transport layer 70, all between an anode and a cathode. In the comparative example, although the electron blocking layer 50 is positioned adjacent to the organic emitting layer 60, electrons escaped from the organic emitting layer 60 may be disposed between the hole transport layer 30 and the electron blocking layer 50. Escaped electrons can be easily excited, and can be combined with holes to cause leakage of emission in the hole transport layer 30 in addition to the organic emitting layer 60. Also, some electrons that have moved into the hole transport layer 30 deteriorate the hole transport layer 30, which lowers a lifespan of the organic light-emitting device of the comparative example.

It may be ideal to use a material that has a broad energy bandgap for the electron blocking layer 50, which has a high LUMO energy level and a low HOMO energy level, but it is difficult to obtain such a material for the electron blocking layer 50. The energy bandgap of the electron blocking layer 50 is 2 eV to 3 eV, and it is difficult to formulate a material having a broad energy bandgap for the electron blocking layer. Embodiments of the present disclosure use a structural change in the organic light-emitting device by introducing the trapping layer 140 between the hole transport layer 130 and the electron blocking layer 150 to overcome the material limit of the electron blocking layer.

In the comparative example and experimental examples, characteristics between time-luminance and driving voltages are compared without a trapping layer (with "Ref" being the comparative example) or by varying the thicknesses of the trapping layer to be 5 Å, 10 Å, and 20 Å.

Figure 6:
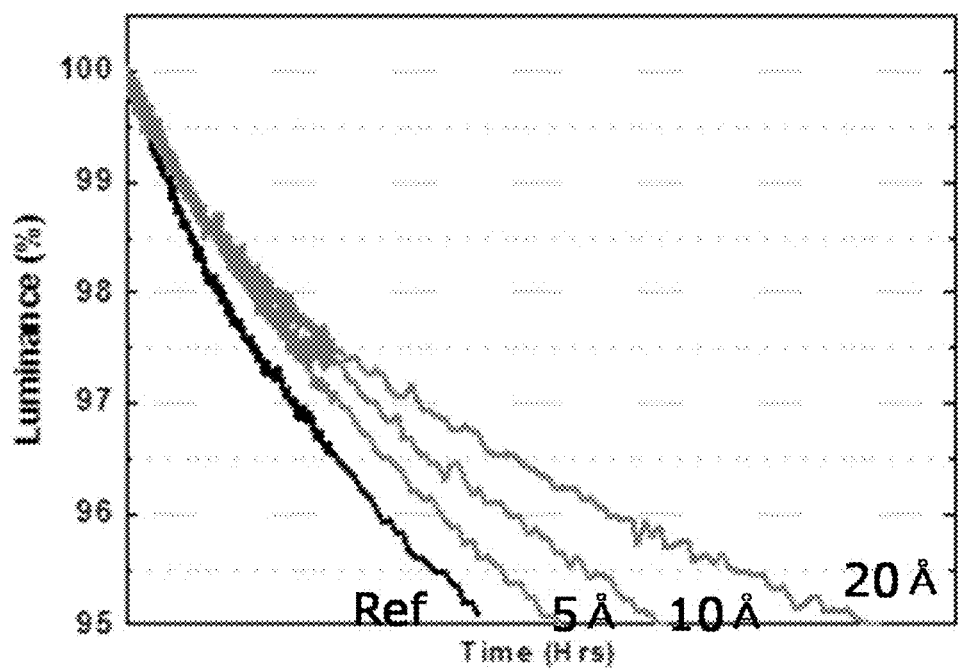
FIG. 6 is a graph showing lifespans of an organic light-emitting device in accordance with comparative and experimental examples by varying the thicknesses of the trapping layer.

FIG. 6 is a graph showing lifespans of an organic light-emitting device in accordance with the comparative and experimental examples by varying the thicknesses of the trapping layer.

As shown in FIG. 6, lifespans are increased in all experimental examples over the comparative example (Ref), and the lifespan is increased as the thickness of the trapping layer 140 becomes thicker. On the contrary, a lifespan in the comparative example having no trapping layer is less than the lifespan of embodiments, even in the experimental example of the 5 Å thickness of the trapping layer 140 of the thinnest experimental example. The graph illustrates a time over which a luminance is changed from an initial 100% state to a 95% luminance.

Figure 7:
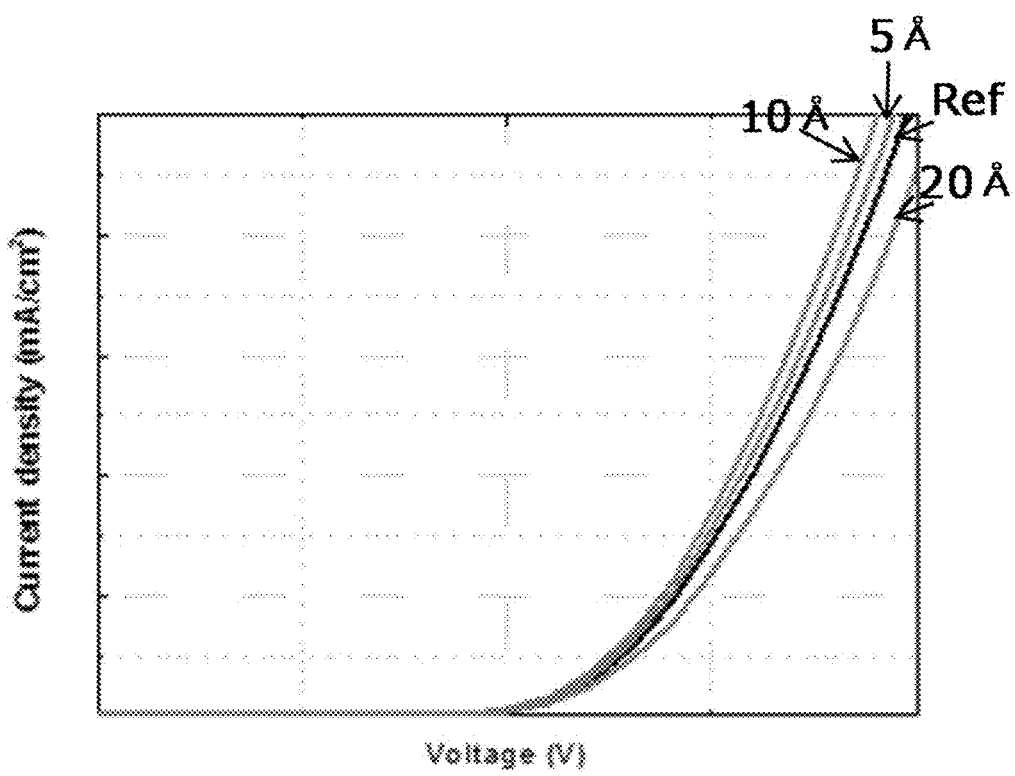
FIG. 7 is a graph showing driving voltages of an organic light-emitting device in accordance with the comparative and experimental examples by varying the thicknesses of the trapping layer.

FIG. 7 is a graph showing driving voltages of an organic light-emitting device in accordance with the comparative and experimental examples by varying the thicknesses of the trapping layer.

As shown in FIG. 7, in the examples providing the trapping layer 140 having the thickness as 5 Å and 10 Å, the driving voltages are lowered in comparison with the driving voltage of the comparative example by 0.1 V or more. However, the case in which the trapping layer 140 has the thickness as 20 Å, the driving voltage is increased in comparison with the driving voltage of the comparative example. That is, to both increase the lifespan and lower the driving voltage, the thickness of the trapping layer may be in a range of, e.g., 5 Å to 10 Å. Meanwhile, the organic light-emitting display of embodiments may apply the organic light-emitting device of embodiments at each sub-pixel.

Figure 8:
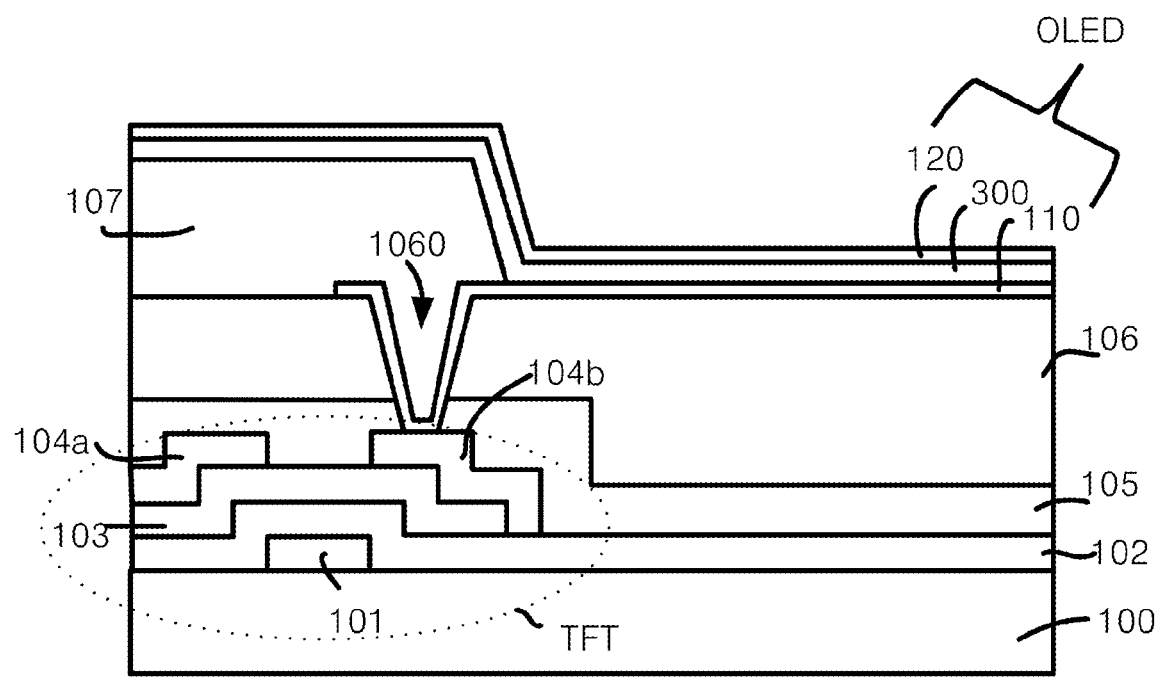
FIG. 8 is a cross-sectional view illustrating an organic light-emitting display in accordance with an embodiment of the present disclosure.

FIG. 8 is a cross-sectional view illustrating an organic light-emitting display in accordance with an embodiment of the present disclosure.

As shown in the FIG. 8 example, the organic light-emitting display in accordance with the present disclosure may include a substrate 100, including a plurality of sub-pixels, thin film transistors (TFTs) of the respective sub-pixels being provided on the substrate 100, and an organic light-emitting device including an anode 110 and a cathode 120. For example, the anode 110 or the cathode 120 of each organic light-emitting device may be connected to each TFT. Although FIG. 8 illustrates one sub-pixel, additional sub-pixels having a similar configuration may be arranged in a matrix on the substrate 100.

For example, the thin film transistor may include a gate electrode 101 provided in a designated region on the substrate 100, a gate insulating film 102 on the substrate 100 to cover the gate electrode 101, a semiconductor layer 103 on the gate insulating film 102 to correspond to the gate electrode 101, and a source electrode 104a and a drain electrode 104b at respective sides of the semiconductor layer 103.

Further, an inorganic protective film 105 and an organic protective film 106 may be sequentially provided to cover the source electrode 104a and the drain electrode 104b, and the anode 110 or the cathode 120 may be connected to the drain electrode 104b via a contact hole 1060 formed through the organic protective film 106 and the inorganic protective film 105 to expose a part of the drain electrode 104b.

For example, if the anode 110 is connected to the drain electrode 104b, an organic stack 300, in which a hole transport layer (HTL) 130, a trapping layer (CNL) 140, an electron blocking layer (EBL) 150, an organic emitting layer (EML) 160, and an electron transport layer (ETL) 170 are sequentially deposited, may be formed on the anode 110, and the cathode 120 may be provided on the organic stack 300, similarly to the stack S shown in the FIG. 1 example. Further, the organic stack 300 may be replaced with the stack structure shown in FIG. 4.

On the other hand, if the cathode 120 is connected to the drain electrode 104b, an organic stack, in which the above-described elements are provided in reverse order, may be provided. That is, an electron transport layer (ETL) 170, an organic emitting layer (EML) 160, an electron blocking layer (EBL) 150, a trapping layer (CNL) 140, and a hole transport layer (HTL) 130 may be sequentially deposited on the cathode, and then an anode may be formed on the hole transport layer (HTL) 130. In some cases, a hole injection layer may be further provided between the anode 110 and a hole transport layer (HTL) 130, and an electron injection layer may be further provided between the electron transport layer (ETL) 170 and the cathode 120.

Further, although the FIG. 8 example shows a bank 107 provided to define an emission zone, the bank 107 may be omitted, and the emission zone may be defined by other structures. The organic stack and the cathode 120 may be provided in common for all sub-pixels. Colors of the sub-pixels may be discriminated by color filters.

Moreover, although the FIG. 8 example illustrates an organic light-emitting device in accordance with the embodiment shown in the FIG. 1 example, embodiments are not limited thereto. For example, the organic light-emitting device in accordance with the embodiment shown in the example of FIG. 4, in which a plurality of stacks is provided between an anode and a cathode, may be provided.

The above-described organic light-emitting display may achieve color expression by emitting different colors of light through the organic emitting layers of the respective sub-pixels, or may achieve color expression by adding a color filter layer to a light-emitting portion of a common organic emitting layer. Embodiments are not limited to these examples.

Such an organic light-emitting display including the above-described organic light-emitting device may have the same effects as the above-described organic light-emitting device. As apparent from the above description, an organic light-emitting device and an organic light-emitting display using the same in accordance with an embodiment of the present disclosure may have effects described below.

First, embodiments may provide a trapping layer between the hole transport layer and the electron blocking layer, and may use the material for the trapping layer having a low LUMO energy level similar to the HOMO energy levels of the hole transport layer and the electron blocking layer. Thus, the energy level of electrons into the trapping layer may be lowered to a ground state, and it may block electrons that have escaped from the electron blocking layer from being excited. Also, embodiments may prevent deterioration of the hole transport layer, and may prevent an increase of the driving voltage.

Also, when the holes are transported from the hole transport layer to the organic emitting layer, the holes cannot react to the electrons of a low energy level in the trapping layer. Thus, embodiments may block leakage of emission outside of the organic emitting layer.

Further, escaped electrons from the electron blocking layer can be captured in the trapping layer and the empty sites of the electron blocking layer and the organic emitting layer addition due to the electrons' escaping may be occupied with holes. Thus, embodiments may help holes to be more easily transported from the hole transport layer into the organic emitting layer. In this case, the trapping layer may function as a charge generation layer, and may increase a lifespan of the organic light-emitting device or the organic light-emitting display.

It will be apparent to those skilled in the art that various modifications and variations may be made in the present disclosure without departing from the technical idea or scope of the disclosure. Thus, it is intended that embodiments of the present disclosure cover the modifications and variations of the disclosure provided they come within the scope of the appended claims and their equivalents.

What is claimed is:

1. An organic light-emitting device, comprising:
   an anode;
   a hole transport layer over the anode;
   an electron blocking layer over the hole transport layer;
   an organic emitting layer contacting the electron blocking layer;
   an electron transport layer contacting the organic emitting layer;
   a cathode over the electron transport layer; and
   a trapping layer between the hole transport layer and the electron blocking layer,
   wherein the trapping layer contacts the hole transport layer and the electron blocking layer at opposite surfaces,
   wherein a LUMO energy level of the trapping layer differs from a HOMO energy level of the electron blocking layer within a range of 1 eV,
   wherein the LUMO energy level of the trapping layer differs from a HOMO energy level of the hole transport layer within a range of 1 eV, and
   wherein the LUMO energy level of the trapping layer is between the HOMO energy level of the hole transport layer and the electron blocking layer.

2. The organic light-emitting device according to claim 1, wherein the LUMO energy level of the trapping layer is lower than the HOMO energy level of the electron blocking layer.

3. The organic light-emitting device according to claim 1, wherein the HOMO energy level of the electron blocking layer is higher than a HOMO energy level of the organic emitting layer by 0.4 eV.

4. The organic light-emitting device according to claim 1, wherein a thickness of the trapping layer is less than or equal to ⅕ times of a thickness of hole transport layer.

5. The organic light-emitting device according to claim 4, wherein the thickness of the trapping layer is about 5 Å to 10 Å.

6. The organic light-emitting device according to claim 1, wherein electrons that have escaped from the electron blocking layer toward the hole transport layer are captured by the trapping layer when voltages are applied to the anode and the cathode.

7. The organic light-emitting device according to claim 1, wherein a LUMO energy level of the electron blocking layer is higher than a LUMO energy level of the organic emitting layer.

8. An organic light-emitting display, comprising:
   a substrate comprising a plurality of subpixels;
   a thin-film transistor in each subpixel over the substrate; and
   an organic light-emitting element at each sub-pixel, the organic light-emitting element comprising:
      an anode;
      a hole transport layer over the anode;
      an electron blocking layer over the hole transport layer;
      an organic emitting layer contacting the electron blocking layer;
      an electron transport layer contacting the organic emitting layer;
      a cathode over the electron transport layer; and
      a trapping layer between the hole transport layer and the electron blocking layer,
   wherein each thin-film transistor is connected to one of: the anode and the cathode, and
   wherein a LUMO energy level of the trapping layer differs from a HOMO energy level of the electron blocking layer within a range of 1 eV,
   wherein the LUMO energy level of the trapping layer differs from a HOMO energy level of the hole transport layer within a range of 1 eV, and
   wherein the LUMO energy level of the trapping layer is between the HOMO energy level of the hole transport layer and the electron blocking layer.

9. The organic light-emitting display according to claim 8, wherein the LUMO energy level of the trapping layer is lower than the HOMO energy level of the electron blocking layer.

10. The organic light-emitting display according to claim 8, wherein the HOMO energy level of the electron blocking layer is higher than a HOMO energy level of the organic emitting layer by 0.4 eV.

11. The organic light-emitting display according to claim 8, wherein a thickness of the trapping layer is less than or equal to ⅕ times of a thickness of hole transport layer.

12. The organic light-emitting display according to claim 8, wherein a LUMO energy level of the electron blocking layer is higher than a LUMO energy level of the organic emitting layer.

* * * * *